United States Patent
Hassner et al.

(10) Patent No.: US 7,272,777 B2
(45) Date of Patent: Sep. 18, 2007

(54) METHOD FOR CORRECTING A BURST OF ERRORS PLUS RANDOM ERRORS

(75) Inventors: Martin Aureliano Hassner, Mountain View, CA (US); Barry Marshall Trager, Yorktown Heights, NY (US); Shumel Winograd, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 485 days.

(21) Appl. No.: 10/453,550

(22) Filed: Jun. 4, 2003

(65) Prior Publication Data
US 2004/0250196 A1    Dec. 9, 2004

(51) Int. Cl.
H03M 13/00 (2006.01)

(52) U.S. Cl. .............. 714/781; 714/784; 714/785

(58) Field of Classification Search ............... 714/784, 714/785, 781
See application file for complete search history.

(56) References Cited

U.S. PATENT DOCUMENTS

| | | | | |
|---|---|---|---|---|
| 3,701,094 A | * | 10/1972 | Howell | 714/762 |
| 4,916,702 A | * | 4/1990 | Berlekamp | 714/762 |
| 5,600,662 A | * | 2/1997 | Zook | 714/769 |
| 5,631,909 A | * | 5/1997 | Weng et al. | 714/704 |
| 5,771,246 A | * | 6/1998 | Weng | 714/762 |
| 5,781,567 A | * | 7/1998 | Sako et al. | 714/762 |
| 5,875,199 A | * | 2/1999 | Luthi | 714/780 |
| 5,917,670 A | * | 6/1999 | Scaramuzzo et al. | 360/53 |
| 5,926,489 A | * | 7/1999 | Luthi et al. | 375/346 |
| 5,942,003 A | * | 8/1999 | Ivry | 714/762 |
| 6,378,100 B1 | * | 4/2002 | Van Dijk et al. | 714/752 |
| 6,532,565 B1 | * | 3/2003 | Roth et al. | 714/761 |
| 6,604,217 B1 | * | 8/2003 | Kahlman | 714/752 |

OTHER PUBLICATIONS

Stephen B. Wicker, Error Control Systems for Digital Communication and Storage, Pretice-Hall 19696, pp. 202-237.*

* cited by examiner

Primary Examiner—Joseph D. Torres
(74) Attorney, Agent, or Firm—Whitham, Curtis, Christofferson & Cook, PC; Stephen C. Kaufman

(57) ABSTRACT

An efficient method for finding all the possible corrections of a bust of length b and e random errors consists of finding a polynomial whose roots are the candidate location for l—the location of the beginning of the burst—thus avoiding the search over all possible values of l (it is assumed that the burst is non-trivial, i.e., at least one of its errors has a non-zero value). In order to reduce the number of spurious solutions, it is assumed that the number of syndromes is t=2e+b+s, where s is at least 2. The larger the value of s the less likely it is that the algorithm will generate "spurious" solutions. Once the location of the burst is known, standard procedures are used to determine the magnitudes of the burst errors and the location and magnitude of the random errors.

8 Claims, 9 Drawing Sheets

METHOD FOR CORRECTING A BURST OF ERRORS PLUS RANDOM ERRORS

BACKGROUND OF THE INVENTION

1. Field of the Invention

The present invention generally relates to coding in information and data processing systems and, more particularly, to a method for correcting a bust of errors plus random errors in data. Such errors may, for example, originate from reading data from a disk drive storing the data.

2. Background Description

Many methods are known for correcting random errors in codes with check symbols. Reed-Solomon codes are designed to correct random errors. If the code has t syndromes then the minimum distance between two code words is t+1 so at most t/2 random errors can be corrected. If some of the errors are erasure errors (i.e., their location is known) then f erasure errors and e random errors can be corrected as long as 2e+f does not exceed t. Methods for correcting those errors are known, and are not a part of this invention.

In many cases it is known that errors may occur in bursts as well as at random locations. For some applications, such as in correcting errors while reading magnetic disks, it is known (or suspected) that a burst of b errors (some of which may have the value 0, i.e., no error occurred at those locations) have occurred (a burst of b errors is b errors whose locations are contiguous) in addition to e random errors. In this case 2e+b+1 cannot exceed t. The usual method for correcting a burst of b errors in addition to e random errors is to start with l=0 (l being the location of the start of the burst) and treat the locations l, l+1, ..., as the location of b erasure errors, and employ one of the known methods for correcting b erasure errors (whose locations are l, l+1, ..., l+b−1) and e random errors. The value of l is then changed to l+1, and the process repeated. It should be emphasized that there may be multiple solutions to a burst of b errors and e random errors, and some other criterion has to be used to resolve this ambiguity when it arises. The drawback of this method is that as many values of l as the length of the code must be checked (more precisely, the length of the code minus (b−1)). Typically, the value of l ranges from 170 to 500-600.

SUMMARY OF THE INVENTION

It is therefore an object of the present invention to provide an efficient method for finding all the possible corrections of a burst of length b and e random errors when b+e is greater than t/2.

According to the invention, the method consists of finding a polynomial whose roots are the candidate location for l—the location of the beginning of the burst—thus avoiding the search over all possible values of l (it is assumed that the burst is non-trivial, i.e., at least one of its errors has a non-zero value). Since the method is most effective for a small e, the invention will be first described for the method in general, followed by a description of the method for e=0, 1, or 2. Also, in order to reduce the number of multiple solutions, it is assumed that t=2e+b+s, where s is at least 2. The larger the value of s, the less likely it is that the algorithm will generate multiple solutions.

Once the location of the burst is known, standard procedures are used to determine the magnitudes of the burst errors and the location and magnitude of the random errors. A method, similar to the disclosed method, for a pure burst (i.e., e=0) appeared in the paper "A burst-error-correcting Algorithm for Reed-Solomon Codes" by J. Chen and P. Owsley in *IEEE Transactions on Information Theory*, Vol. 38, No. 6, November 1992, pp. 1807-1812. This method also finds a polynomial whose roots indicate the location of the burst; however, the details of finding the polynomial of Chen and Owsley are different from the one disclosed here. Some of the differences between our method and the one of Chen and Owsley will be pointed out when we describe out method for e=0.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
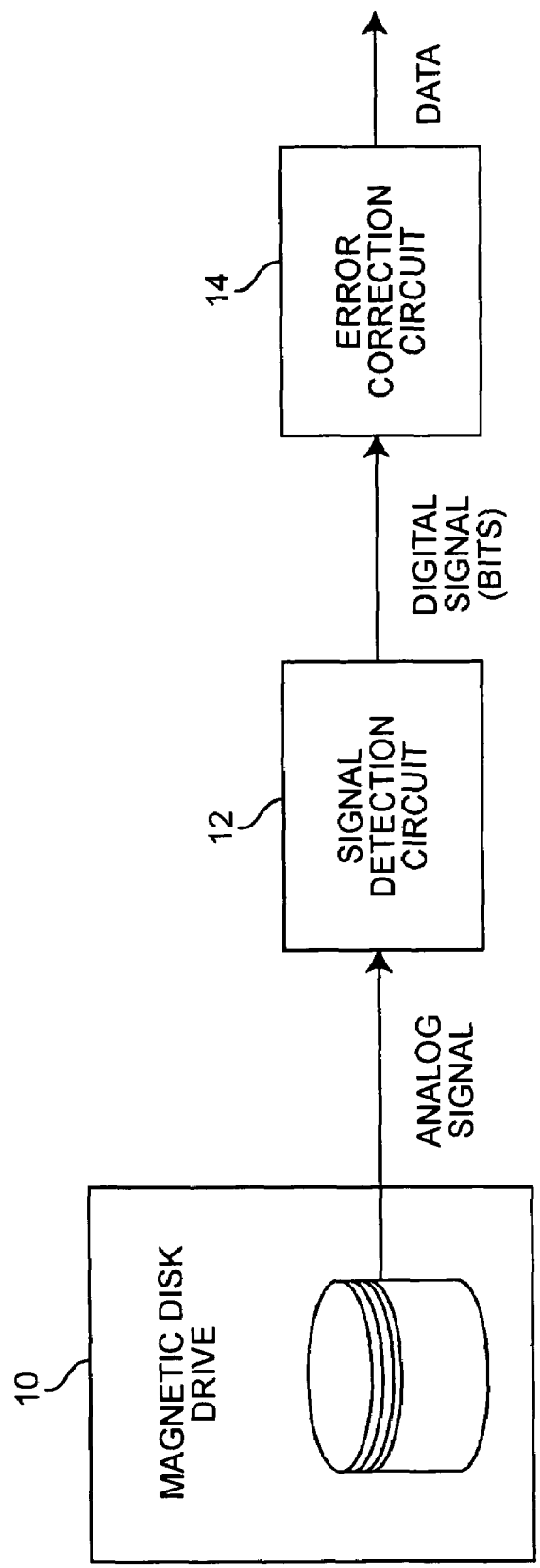
FIG. 1 is a block diagram of an apparatus in which the claimed invention may be implemented.

Referring now to the drawings, and more particularly to FIG. 1, there is shown a block diagram of an apparatus on which the present invention may be implemented. In this implementation, a magnetic disk drive 10 having one or more magnetic recording media disks on which data are recorded provides an analog output signal as recorded data is read. This analog signal is input to a signal detection circuit 12 which produces a digital signal output. This digital signal output is a series of bits (i.e., "0s" and "0s") which may have a burst of errors plus random errors. There errors are, mainly, the result of noise and minute defects in the disk which cause a distortion of the analog signal. This, in turn, causes the interpretation of the signal by the signal detection circuitry to produce wrong bits.

The digital output signal is input to an error correction circuit 14 which implements the method of correcting a burst of errors plus random errors according to the present invention. The output of the error correction circuit 14 is the corrected digital signal.

For a "received" code word $(r_0, r_1, \ldots, r_{(n-1)})$ we denote the t=2e+b+s syndromes by $\sigma_i$, i=0, 1, ..., t−1, where $\sigma_i = \sigma_j r_j a^{ij}$. The syndromes are the inputs to the algorithms implemented by the invention.

Figure 2:
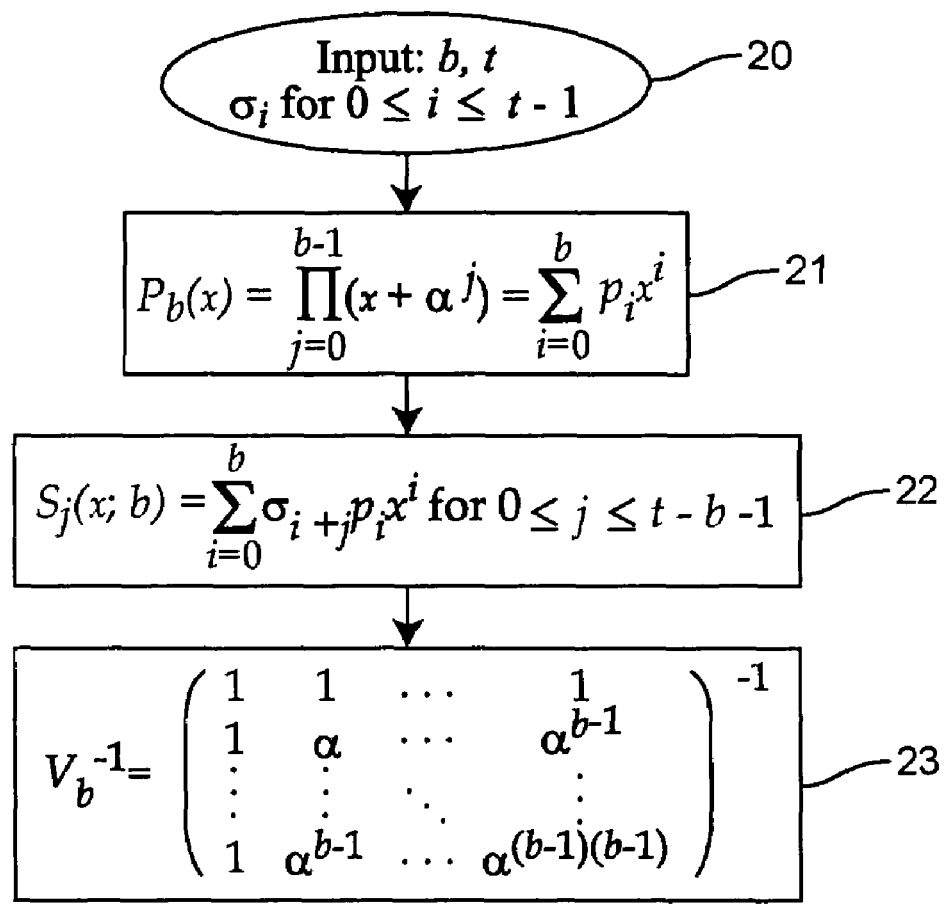
FIG. 2 is a flow diagram of the initialization process performed prior to the process for correcting a bust of errors plus random errors.

The first step in the method is to compute the syndrome polynomials from the syndromes of the received word. This is illustrated in FIG. 2 and is done as follows. For input b, t, syndromes $\sigma_i$, for $0 \leq i \leq t-1$, as the input 20, let $P(x)=\Pi_j(x+a^j)=\Sigma_i p_i x^i$, where j ranges from 0 to b−1, and i ranges from 0 to b in function block 21. It is important to note that the $p_i$s are computed beforehand and do not have to be computed every time that the algorithm is run. The first step of the method in function block 22 is to compute the syndrome polynomials $S_j(x)=\Sigma_i \sigma_{i+j}=p_i=p_i=x^i$, for $j=0, 1, \ldots, 2e+s-1$ and i ranges from 0 to b. At times, the length of the burst will be emphasized and the syndrome polynomials denoted by $S_j(x;b)$. The next step in function block 23 is to compute $V_b^{-1}$, where $V_b$ is the Vandermonde matrix $V_b=(a^{ij})$, $0 \leq i,j \leq b-1$.

Figure 3A:
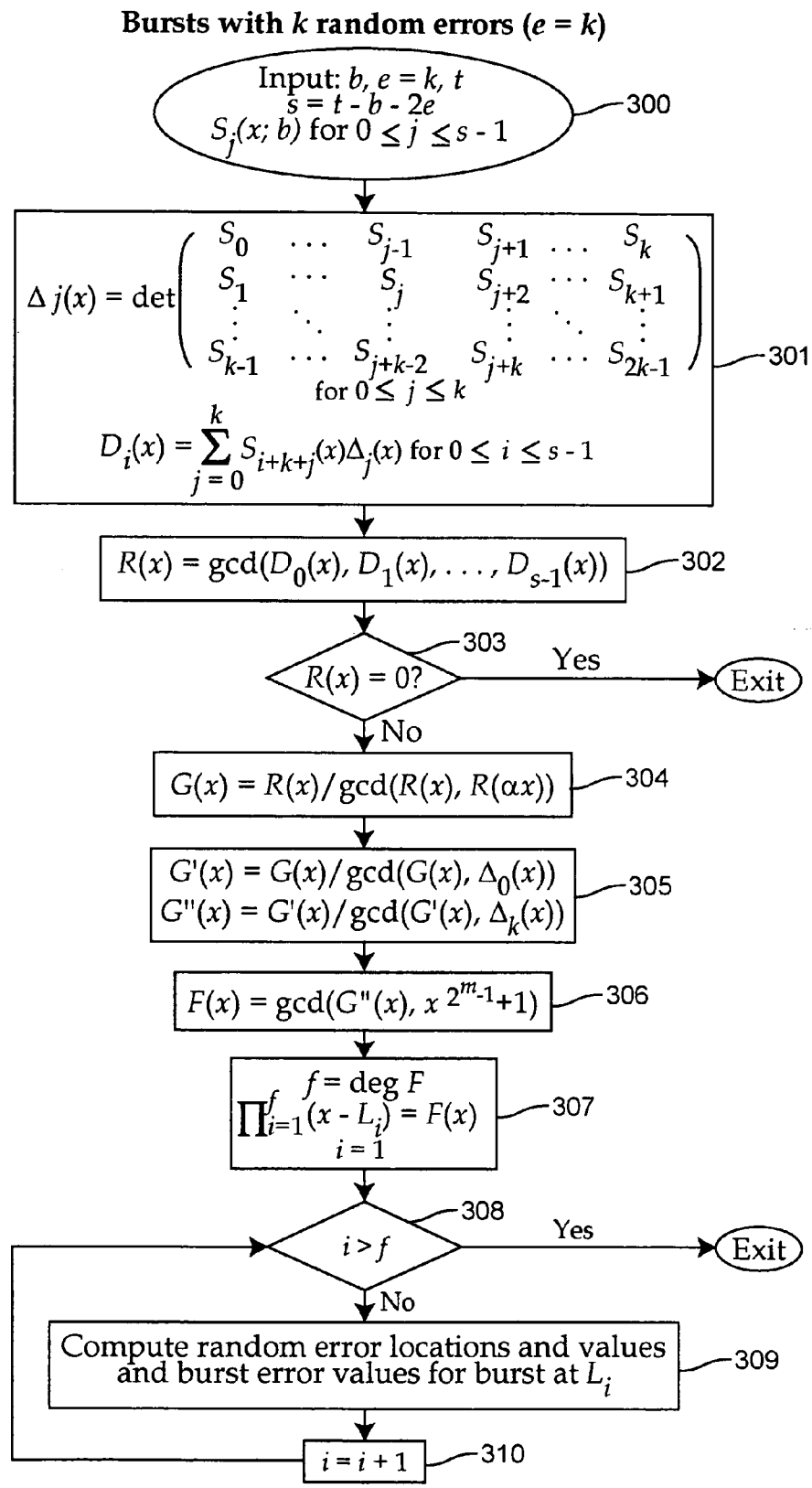
FIGS. 3A and 3B, taken together, is a flow diagram of the process implemented by the method according to the invention for correcting a burst of errors plus a generalized number of random errors.
Figure 3B:
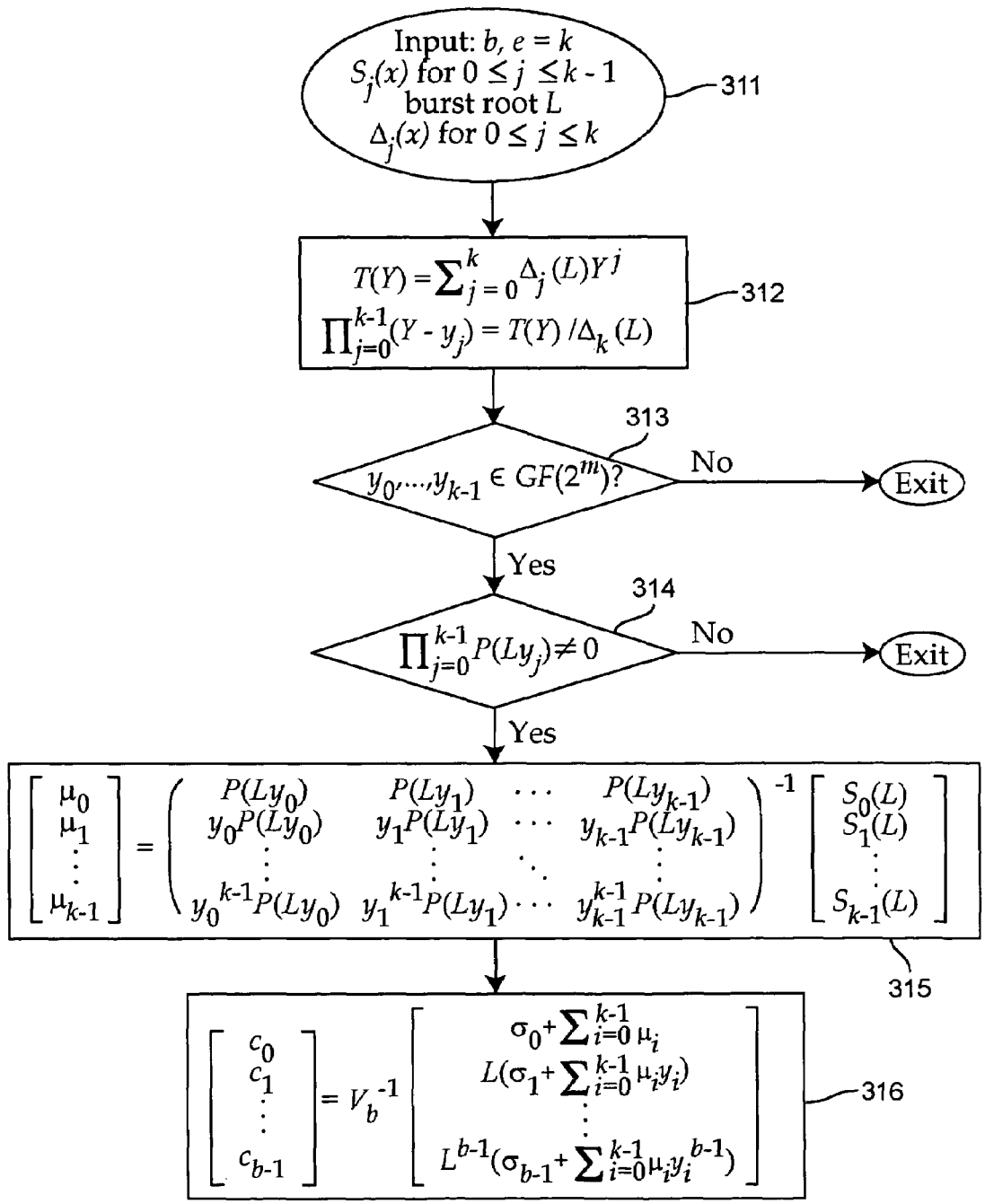

The method according to the invention will now be described for the general case of k random errors (e=k). The process is shown in FIGS. 3A and 3B, to which reference is not made. The input at block 300 is b, e=k, t, s=t-b-2e, and $S_j(x, b)$ for $0 \leq j \leq s-1$. We define $k=(k+1)$ matrix A as the matrix whose $(i,j)^{th}$ element is $S_{i,j}(x)$, where $i=0, 1, \ldots, k-1$ and $j=0, 1, \ldots, k$. We define the $(k+1) \times (k+1)$ matrices $B_i$ as having A as the first k rows and $(S_{i-k}(x), S_{i-k+1}(x), \ldots, S_{i+2k}(x))$ as its $(k+1)^{st}$ row for $i=0, 1, \ldots, s-1$. We also define the k×k matrices $C_j$ as A with its $j^{th}$ column removed for $j=0, 1, \ldots, k$. In function block 301, the polynomials $\Delta_j(x)=\det(C_j)$ for $j=0, 1, \ldots, k$ are computed. We also compute the polynomials $D_i(x)=\det(B_i)=\Sigma_j S_{i+k+j}(x)\Delta_j(x)$, for $i=0, 1, \ldots, s-1$, where j ranges from 0 to k. If l is the location where the burst begins, then $L=a^{-l}$ is a root of each of the polynomial $D_i(x)$, so in function block 302, $R(x)=\gcd(D_0(x), D_1(x), \ldots, D_{s-1}(x))$ (the greatest common divisor (gcd) of the $D_i(x)$'s) is computed. A determination is made in decision block 303 as to whether $R(x)$ is zero. If so, the algorithm is terminated since, in this case no burst errors have occurred. The polynomial $R(x)$ has the property that $L=a^{-l}$ is one of its roots, then l is a candidate for the location of the beginning of the burst. The degree of $R(x)$ may be large because of "spurious" roots, so the next stages of the method are aimed at reducing its degree, and thus resulting in fewer candidate for 1. In function block 303, we compute:

$G(x)=R(x)/\gcd(R(x), R(ax))$.

(Alternatively, $G(x)=R(x)/\gcd(R(x), R(a^{-1}x))$ may be computed.) This is useful when the size of the actual burst was smaller than b—in which case several roots of $R(x)$ identify the same burst—and has the effect of removing this redundancy.

If $L=a^{-l}$ is a root of $G(x)$, then the roots $\Sigma_j \Delta_j(L) y^j$, where j ranges from 0 to k, indicate the locations of the k random errors. Thus, $\Sigma_j \Delta_j y^j$ has to have k roots, non of which is 0; that is, $\Delta_0(L)$ and $\Delta_k(L)$ must not vanish. That is accomplished in function block 305, where we compute:

$G'(x)=G(x)/\gcd(G(x), \Delta_0(x))$, and $G''(x)=G'(x)/\gcd(G'(x), \Delta_k(x))$.

Of course, we are interested only in the roots of $G''(x)$ which lie in the field, and remove all the roots which lie in a larger field. This is done in function block 306 where $F(x)=\gcd(G''(x), x^{2^m-1}+1)$ is computed. The roots of $F(x)$ are then found in function block 307, and the method then enters the processing loop at decision block 308 where a determination is made as to whether all the roots of $F(x)$ were considered. If so, the process exists; otherwise, in function block 309 (explained in greater detail in FIG. 3B) we compute the locations and values of the k random errors. In FIG. 3B, for every $L=a^{-l}$ which is a root of $F(x)$ in input 311, the polynomial $T(Y)=\Sigma_j \Delta_j(L) Y^j$ where j ranges from 0 to k is considered considered in function block 312, and its k roots are denoted by $y_i=a^{l(i)}$. (If it does not have k distinct roots in the field, or if any of the $y_i$'s is between 1 and l+b-1, then there is no error pattern with a burst beginning at l, and we look at the next root of $F(x)$. A determination is made in decision block 313 as to whether all the roots of $T(Y)$ are in the field, and in decision block 314, we check if all the $P(L_i y_{i,j})$'s are not equal to zero; i.e., if the locations of the random errors are not included in the burst. If not, the process loops forward to function block 315. The beginning of the burst is at location l, and the k random errors are at locations $l(i)$, $i=0, 1, \ldots, k-1$. In function block 315, we compute the magnitudes of $\mu_0, \mu_1, \ldots, \mu_k$ of the random errors, that is, we define the k×k matrix $W(L)$ as having $(y_j)^i$ as its $(ij)^{th}$ element (i and j range from 0 to k-1). The vector $\mu(L)=(\mu_0, \mu_1, \ldots, \mu_{k-1})^T$ of the magnitudes of the random errors is computed by $\mu(L)=D(L)^{-1}W(L)^{-}S(L)$, where $D(L)$ is the diagonal matrix $D(L)=\text{diag}(P(Ly_0), P(Ly_1), \ldots, P(Ly_{k-1})$ and $S(L)=(S_0(L), S_1(L), \ldots, S_{k-1}(L))^T$. To obtain the magnitude of the errors of the burst we compute in function block 316 $c=V_b^{-1} \times L \times (\sigma+\Sigma_i y_i)$ where i ranges from 0 to k-1, k-1, Vb as in function 23 of FIG. 2, and $\sigma=(\sigma_0, \sigma_1, \sigma_2, \ldots, \sigma_{b-1}))^T$. Returning to FIG. 3A, in function block 310, i is incremented by "1" before the process loops back to decision block 308.

Figure 4:
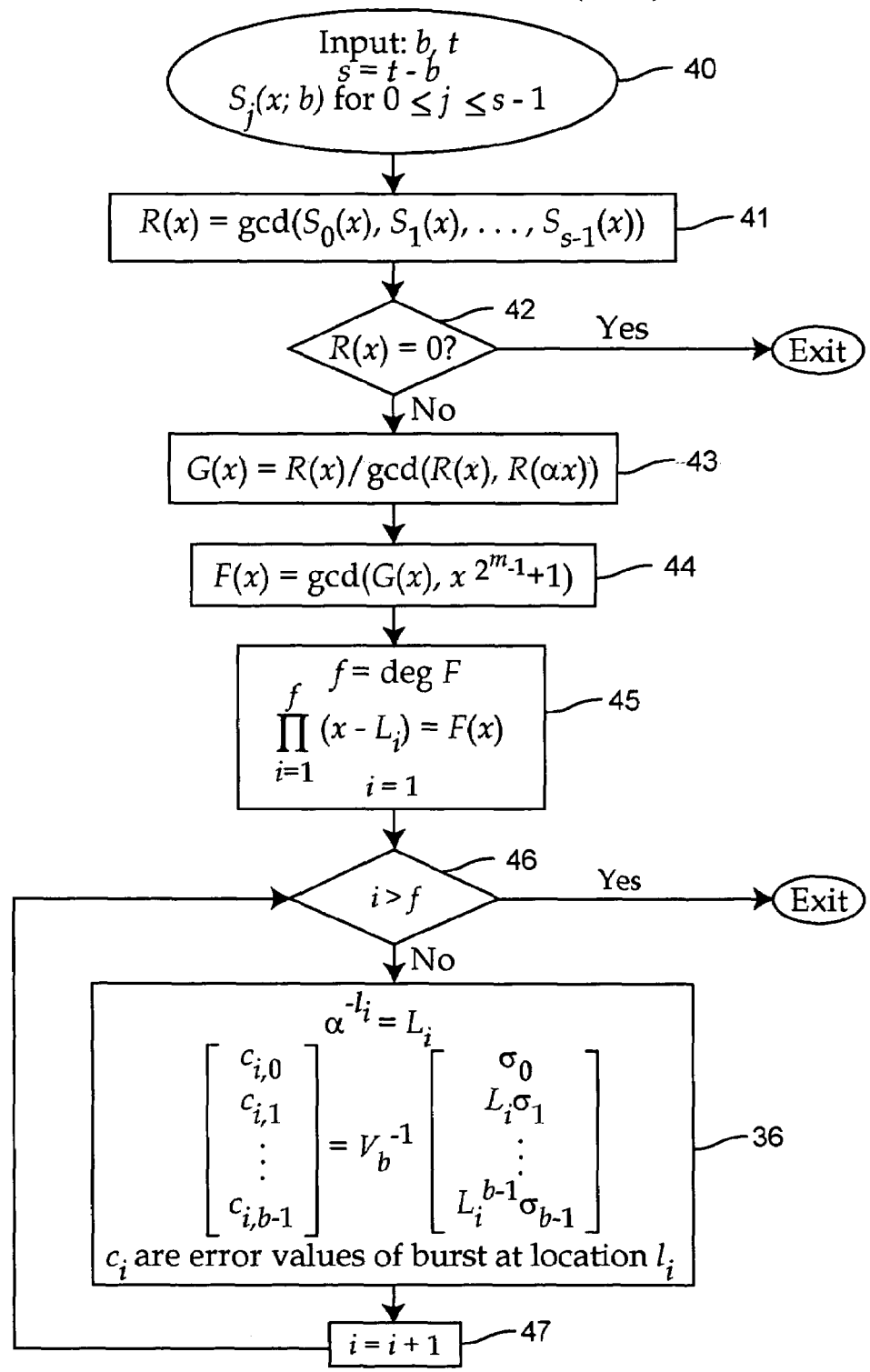
FIG. 4 is a flow diagram of the process implemented by the method according to the invention for correcting a burst of errors and no random errors.

For the case of no random errors (e=0), the general method simplifies as is illustrated in FIG. 4. The input at block 40 is b, t, where s=t-b, $S_j(x, b)$ for $0 \leq j \leq s-1$. There is no need to compute the determinants separately, since $D_i(x)=S_i(x)$, so in function block 41, we compute $R(x)=\gcd(S_0(x), S_1(x), \ldots, S_{s-1}(x))$, where, again, "gcd" denotes the greatest common divisor. (The method of Chen and Owsley starts with a different polynomial of a larger degree, and therefore is less efficient.) A determination is made in decision block 42 as to whether computed $R(x)$ is equal to zero. If $R(x)=0$, the algorithm terminates, since no error occurred; otherwise, in function block 43, $G(x)=R(x)/\gcd(R(x), R(ax))$ (to remove redundant solutions in case the length of the actual burst was smaller than b) is computed. (Alternatively, $G(x)=R(x)/\gcd(R(x), R(a^{-1}))$ may be computed.) Here, too, we differ from Chen and Owsley, who do not describe a mechanism for removing redundant roots when the length of the burst is shorter than b. Next, in function block 44, $F(x)=\gcd(G(x), x^{2^m-1}+1)$ is computed (to remove all the roots which are not in the field). Chen and Owsley do not have a mechanism for removing roots which are not in the field. For each $L=a^{-l}$ which is a root of $F(x)$, a "received" word with a burst of b errors beginning at l is corrected. Thus, in function block 45, we find all the roots of $F(x)$. A determination is made in decision block 46 at the beginning of the processing loop as to whether all the roots of $F(x)$ were used. If so, the process exits; otherwise, $c=(c_0, c_1, \ldots, c_{b-1})^T$, the vector of corrections, is computed in function block 36 as $c=V_b^{-1} \times L \times \sigma$, where $Vb^{-1}$ is as computed in block 23 (FIG. 2) of the initialization, L is the diagonal matrix $L=\text{diag}(1, L, \ldots, L^{h-1})$, and $\sigma=(\sigma_0, \sigma_1, \sigma_2, \ldots, \sigma_{b-1})^T$. Next, l is indexed by "1" in function block 47 before the process loops back to decision block 46.

Figure 5A:
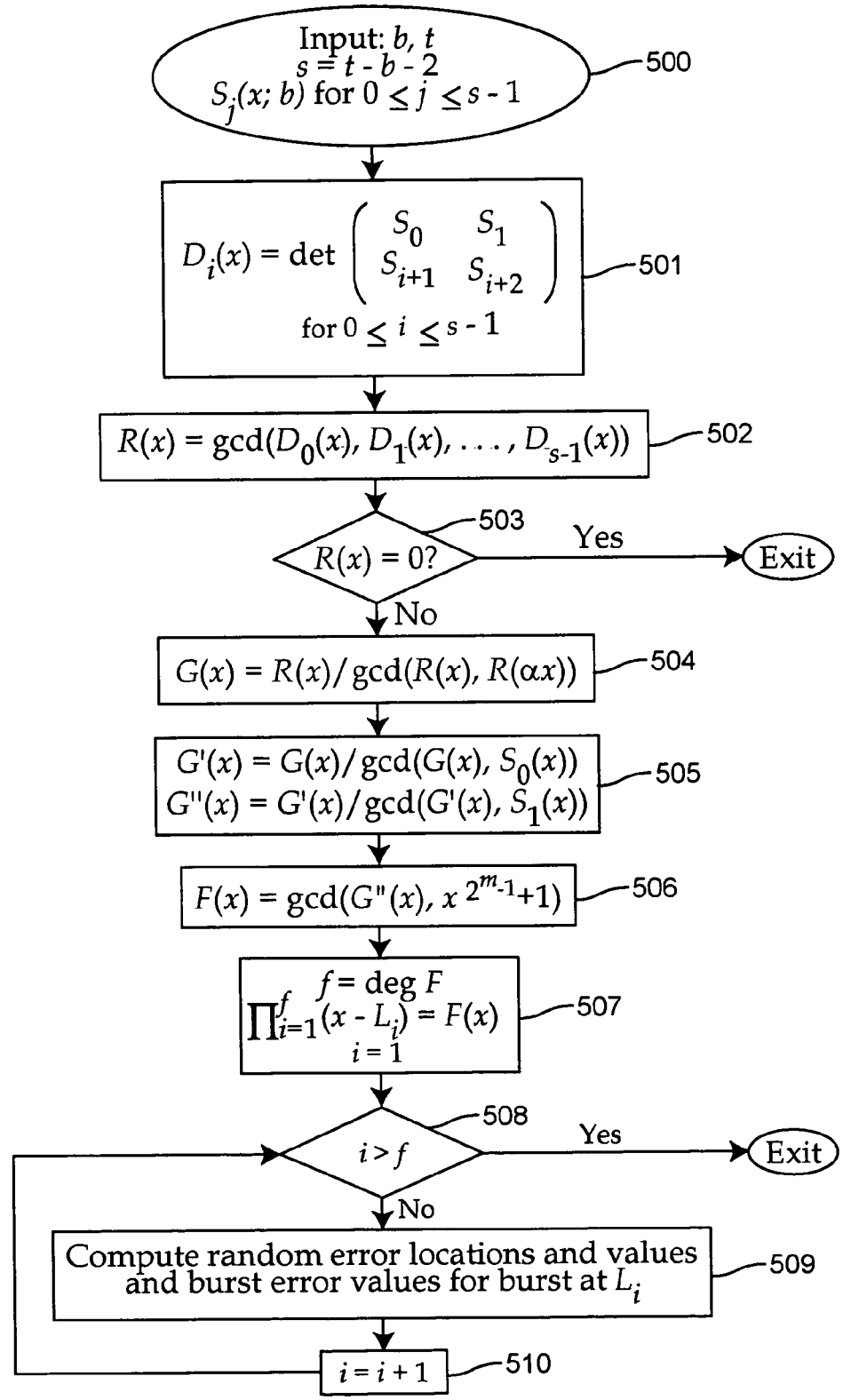
FIGS. 5A and 5B, taken together, is a flow diagram of the process implemented by the method according to the invention for correcting a burst of errors plus one random error.
Figure 5B:
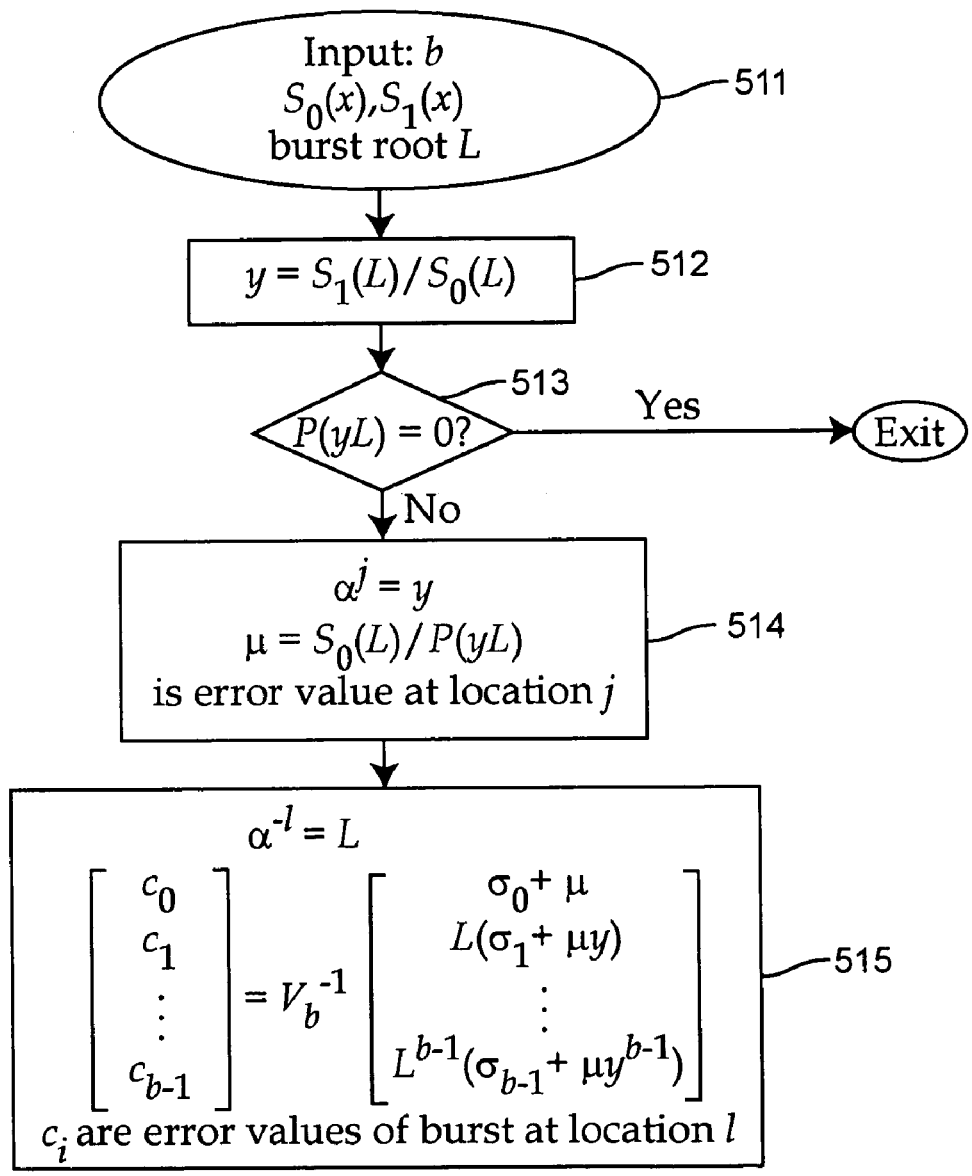

For the case of one random error (e=1), the method is shown in FIGS. 5A and 5B. The reasons for performing the steps are as in the general case e=k described with respect to FIGS. 3A and 3B. The method proceeds as follows. The input at block 500 is b, t, where s=t-b-1, $S_j(x, b)$ for $0 \leq j \leq s-1$. First, in function block 501, $D_i(x)=S_0(x)S_{i+2}(x)+S_1(x)S_{i+1}(x)$ for $i=0, 1, \ldots, s-1$ is computed. (Note that in this case, the $\Delta_j(x)$'s do not have to be computed). Next, in function block 502, $R(x)=\gcd(D_0(x), D_1(x), \ldots, D_{s-1}(x))$ is computed. In decision block 503, a determination is made as to whether $R(x)$ is zero. If so, the algorithm is terminated; otherwise, in function block 504, the following is computed:

$G(x)=R(x)/\gcd®(x),R(ax)),$ and in function block 505, the following are computed:

$G'(x)=G(x)/\gcd(G(x),S_0(x)),$ and $G''(x)=G'(x)/\gcd(G'(x), S_1(x)).$ (Alternatively, $G(x)=R(x)/\gcd(R(x), R(a^{-1}x))$ may be computed.) In function block 505, we remove all roots which are also roots of $S_0(x)$ or $S_1(x)$, thus ensuring that we will not have to consider those roots, L, of $F(x)$ for which $S_1(L)/S_0)L$ is either zero or not defined. In function block 506, we compute $F(x)=\gcd(G''(x), x^{2m-1}+1)$. As in the general case, we find all the roots of $F(x)$ in function block 507 before entering the processing loop 506 which, for each root of $F(x)$ finds the location and magnitude of the random error as well as the magnitude of the burst corrections. In the processing loop 509, described in more detail in FIG. 5B, for every $L=a^{-1}$ input at 511 which is a root of $F(x)$, $y=S^!(L)/S_0(L)=a^j$ is computed in function block 512. Then we check in decision block 513 whether j is between l and l+b−1. If it is, then there is no solution with this value of L; if it is not, we proceed to compute the location of the random error and its magnitude in function block 514 and the magnitudes of the burst errors in function block 515. The location of the random error, $y_1$, is computed by $y_i=S_1(L_i)/S_0(L_i)$, its magnitude, μ, is $S_0(L_i)/P(y_iL_i)$, and the magnitudes of the burst errors are computed by $c=V_b^{-1}\times L=(\sigma+y)$, where $y=(\mu\bullet(1, y, y^2, \ldots, y^{b-1})T$, where $V_b$, L, and σ are as before. Returning to FIG. 5A, in function block 510, I is incremented by "1" before the process loops back to decision block 508.

Figure 6A:
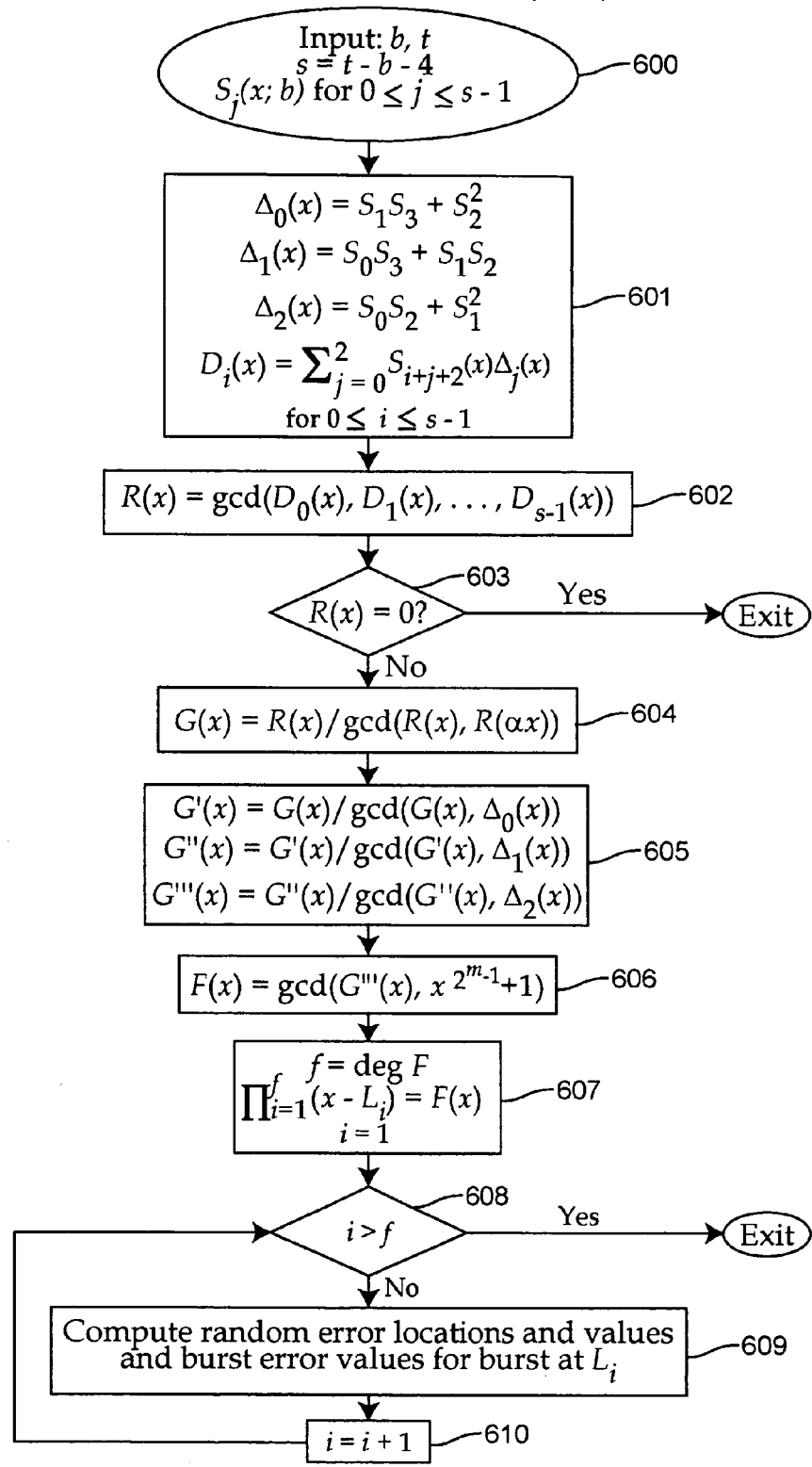
FIGS. 6A and 6B, taken together, is a flow diagram of the process implemented by the method according to the invention for correcting a burst of errors plus two random errors.
Figure 6B:
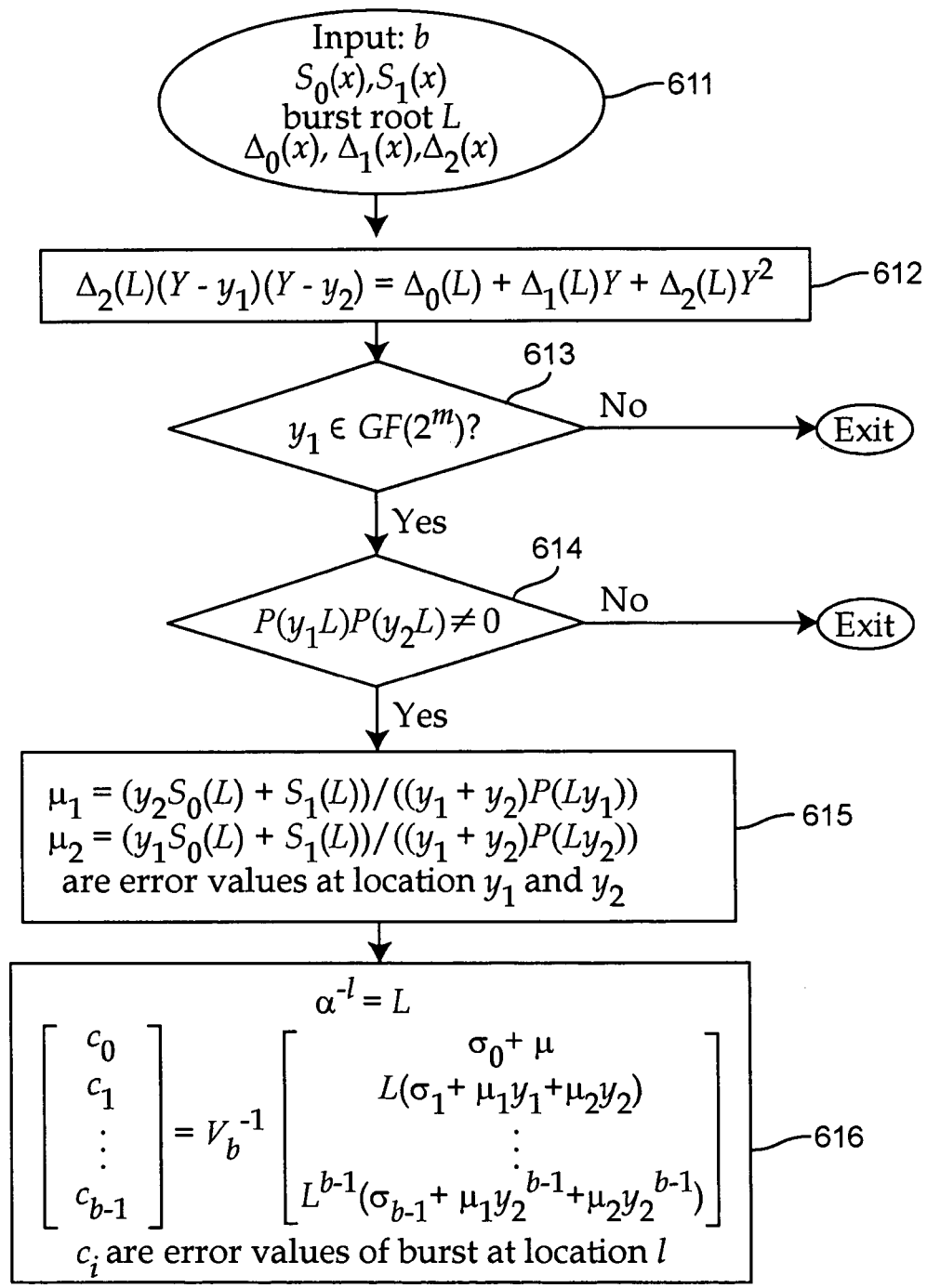

For the case of two random errors (e=2), the method is known in FIGS. 6A and 6B. It proceeds just as in the general case e=k, with blocks 600, 601, 602, 603, and 604 of FIG. 6A performing the same functions as blocks 300, 301, 302, 303, and 304 in FIG. 3A. Function block 605 is unique to e=2, it computes:

$G'(x)=G(x)/\gcd(G(x), \Delta_0(x)),$ $G''(x)=G'(x)/\gcd(G'(x), \Delta_1(x)),$ and $G'''(x)=G''(x)/\gcd(G''(x), \Delta_2(x)).$ The reason for computing $G''(x)=G'(x)/\gcd(G'(x), \Delta_1(x))$ is that the two roots of the polynomial $\Delta^0(L)+\Delta_1(L)-y+(\Delta_2(L)y^2$ give the locations of the two random errors, and therefore these two roots have to be distinct; i.e., $\Delta_1(L)$ has to be different from zero. Function block 606 and function block 607, decision block 608, and function blocks 609 and 610, as well as blocks 611, 612, 613, 614, 615 and 616 of FIG. 6B perform the same functions as blocks 306, 307, 308, 309, and 310 of FIG. 3A, as well as FIG. 3B (specialized, of course, to the case of two random errors). In the processing loop 609, described in more detail in FIG. 6B, for every L input at 611 which is a root of $\Delta^2(L)(Y-y_1)(Y-y_2)=\Delta_0(L)+\Delta_1(L)Y+\Delta_2(L)Y^2$ is computed in function block 612. Then we check in decision block 613 whether $y_1$ is an element of $GF(2^m)$. If it is, then there is no solution with this value of Δ; if it is not, we check in decision block 614 whether the magnitudes of the 2 random errors is equal to zero. If they are, then there is no solution: if they are not then we compute the location of the random error and its magnitude in function block 615 and the magnitudes of the burst errors in function block 616.

An important part of the invention is that we use more syndromes than absolutely necessary. The number of syndromes is t=b+2e=s where s is at least two. The larger s, the more likely are we to obtain only one (or no) correction.

In applications such as correcting the errors in reading data off the disk, we do not know the number of random errors a-priori. One way of applying the algorithm to first use if for e=0, then for e=1, etc., until e=E (the maximum number of random errors which we can correct, i.e., t=2E+b+s). The advantage of this algorithm is that we can use the determinants computed for e−k to compute the determinants for e−k+1. Also, when e is less than E, we get a larger protection against spurious errors, since t=2e+b+(s+2(E−e)). Another way of using this "excess" of syndromes when e is smaller than E is to search for corrections with bursts of length b+2(E−e). This enables us to obtain possible corrections which we would not have been able to discover otherwise.

Since the length of the burst will be variable, it would be useful, at times, to indicate the length of the burst. Thus, we will use $P^{(b)}(x)$ denote the polynomial whose roots are $a^j$ (j=0, 1, \ldots, b−1), use $V^{(b)}$ and $L^{(b)}$ to indicate the dimension of these matrices, and similarly for σ and $y_i$. The algorithm proceeds as follows. Use the algorithm described above for e=0 using $P^{(b+2E)}(x)$, $V^{(b+2E)}$, and $L^{(b+2E)}$. Denote the polynomial $F(x)$ by $F_0(x)$. Having checked for corrections with e=0, \ldots, k−1 random errors (and burst lengths b+2E, \ldots, b+2(E−k+1) respectively) we use the algorithm for e=k (using $P^{(b+2(E-k)}(x))$ up to the point where we computed gcd $(G''(x), Q(x))$ where $Q(x)=x^{2m-1}+1$ is the field polynomial. We denote this last polynomial by $H_0(x)$. We then compute $H_i(x)=H_{i-1}(x)/\gcd(H_{i-1}(x), F_{i-1}(x))$ for i=1, 2, \ldots, k. We will denote $H_k(x)$ by $F_k(x)$. We then continue the previously described algorithm, replacing $F(x)$ by $F_k(x)$ (and, of course, $\sigma^{(b+2(E-k))}$, $y_i^{(b+2(E-k))}$, $V^{(b+2(E-k)}$, and $L^{(b+2(E-k))}$). This is done for k=1, 2, \ldots, E.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for finding possible corrections of a burst of errors of length b and random errors, e, in data, comprising the steps of:
    inputting date and t syndromes of a t-syndrome error correction code, whereby the t-syndrome error correction code is capable of correcting a burst of length b and e random errors when b+e is greater than t/2 as long as t=2e+b+s, where s is greater than 2;
    finding possible corrections of a bust of errors of length b and random errors e;
    processing the input data and t syndromes to find a polynomial whose roots are candidate locations, l, of the beginning of said burst of errors of length b in the data;
    determining magnitudes of said burst of errors of length b in the data;
    determining locations and magnitudes of any of said random errors, e, in the data; and
    correcting said burst of errors of length b and said random errors, e.

2. The method for finding possible corrections of burst and random errors in data recited in claim 1, wherein b and e are subject to the constraint $t=2e+b+s$, for some s greater than 2.

3. The method for finding possible corrections of said burst of errors of length b and said random errors, e, in data recited in claim 1, further comprising the step of computing syndrome polynomials from a received word.

4. The method for finding possible corrections of said burst of errors of length b and random errors, e, in data recited in claim 3, wherein syndrome polynomials are computed as $S_j(x)=\Sigma_i \sigma_{i+j} x p_i x x^i$, for $j=0, 1, \ldots, 2e+s-1$ and i ranges from 0 to b, where for a received code word $(r_0, r_1, \ldots, r_{n-1})$, $t=2e+b+s$ syndromes are denoted as $\sigma_i$, $i=0, 1, \ldots, t-1$, where $\sigma_i=\Sigma_k r_k a^{ik}$ and $P(x)=\Pi_j(x+a^j)=\Sigma_i p_i x^i$, where k ranges from 0 to n−1, and i ranges from 0 to b−1.

5. The method for finding possible corrections of said burst of errors of length b and said random errors, e, in data recited in claim 4, wherein said magnitudes of any of said random errors, e, $\mu_i$, in the data are computed as $$\begin{bmatrix} \mu_0 \\ \mu_1 \\ \vdots \\ \mu_{k-1} \end{bmatrix} = \begin{bmatrix} P(Ly_0) & P(Ly_1) & \cdots & P(Ly_{k-1}) \\ y_0 P(Ly_0) & y_1 P(Ly_1) & \cdots & y_{k-1} P(Ly_{k-1}) \\ \vdots & \vdots & \ddots & \vdots \\ y_0^{k-1} P(Ly_0) & y_1^{k-1} P(Ly_1) & \cdots & y_{k-1}^{k-1} P(Ly_{k-1}) \end{bmatrix}^{-1} \begin{bmatrix} S_0(L) \\ S_1(L) \\ \vdots \\ S_{k-1}(L) \end{bmatrix}$$

where k is the number of said random errors, e, $L=a^{-1}$ for a burst stating in position l and $y_i$ specify locations of random errors with i ranging from 0 to k−1.

6. The method for finding possible corrections of said burst of errors of length b and said random errors, e, in data recited in claim 5, wherein the method is repeated for e=0, then for e−1, etc., until e=E, wherein E is a maximum number of said random errors, e, which can be corrected.

7. An apparatus for reading recorded data from a medium and finding possible corrections of a burst of errors of length b and random errors, e, in recorded data, comprising:

a medium storing recorded data;

reading means for reading said recorded data and detecting digital bits in a signal generated by reading said recorded data; and error correcting means receiving detected digital bits as said recorded data read from said medium, said error correcting means computing t syndromes of a t-syndrome error correction code, whereby the t-syndrome error correction code is capable of correcting a burst of length b and e random error when b+e is greater than t/2 as long as $t=2e+b+s$, where s is greater than 2, finding possible corrections of a burst of errors of length b and random errors e, processing said detected digital bits and syndromes to find a polynomial whose roots are candidate locations, l, of the beginning of said burst of errors of length b in said recorded data, determining a magnitude of said burst of errors of length b in said recorded data, determining locations and magnitudes of any of said random errors, e, in said recorded data, and correcting said burst of errors of length b and random errors, e.

8. The apparatus of claim 7, wherein b and e are subject to the constraint $t=2e+b+s$, for some s greater than 2.

* * * * *